United States Patent [19]
Jex et al.

[11] Patent Number: 5,309,012
[45] Date of Patent: May 3, 1994

[54] PROTECTED ERASE VOLTAGE DISCHARGE TRANSISTOR IN A NONVOLATILE SEMICONDUCTOR MEMORY

[75] Inventors: Jerry G. Jex, Forest Grove, Oreg.; Neal R. Mielke, Los Altos Hills, Calif.

[73] Assignee: Intel Corporation, Santa Clara, Calif.

[21] Appl. No.: 971,074

[22] Filed: Nov. 3, 1992

[51] Int. Cl.$^5$ .................... H01L 29/68; H01L 27/02
[52] U.S. Cl. .................... 257/401; 257/314; 257/320; 257/322
[58] Field of Search .............. 257/401, 314, 320, 322

*Primary Examiner*—Mark V. Prenty
*Attorney, Agent, or Firm*—Blakely, Sokoloff, Taylor & Zafman

[57] ABSTRACT

A semiconductor memory having a memory cell for storing a bit of data and a pull-down transistor for coupling the source of the memory cell to ground in order to read the memory cell. The pull-down transistor is comprised of a polysilicon gate coupled to a control means for switching the transistor ON/OFF; a drain diffusion region coupled to the source of the memory cell; and a source diffusion region coupled to ground. The source diffusion region is physically located closer to the memory cell than the drain diffusion region. Two P+ substrate taps are implemented—one on each side of the pull-down transistor. An N+ diffusion bar is coupled to $V_{SS}$. The N+ diffusion bar and the adjacent P+ substrate tap are interleaved in a row and are coupled to metal layers by vias and contacts.

9 Claims, 4 Drawing Sheets

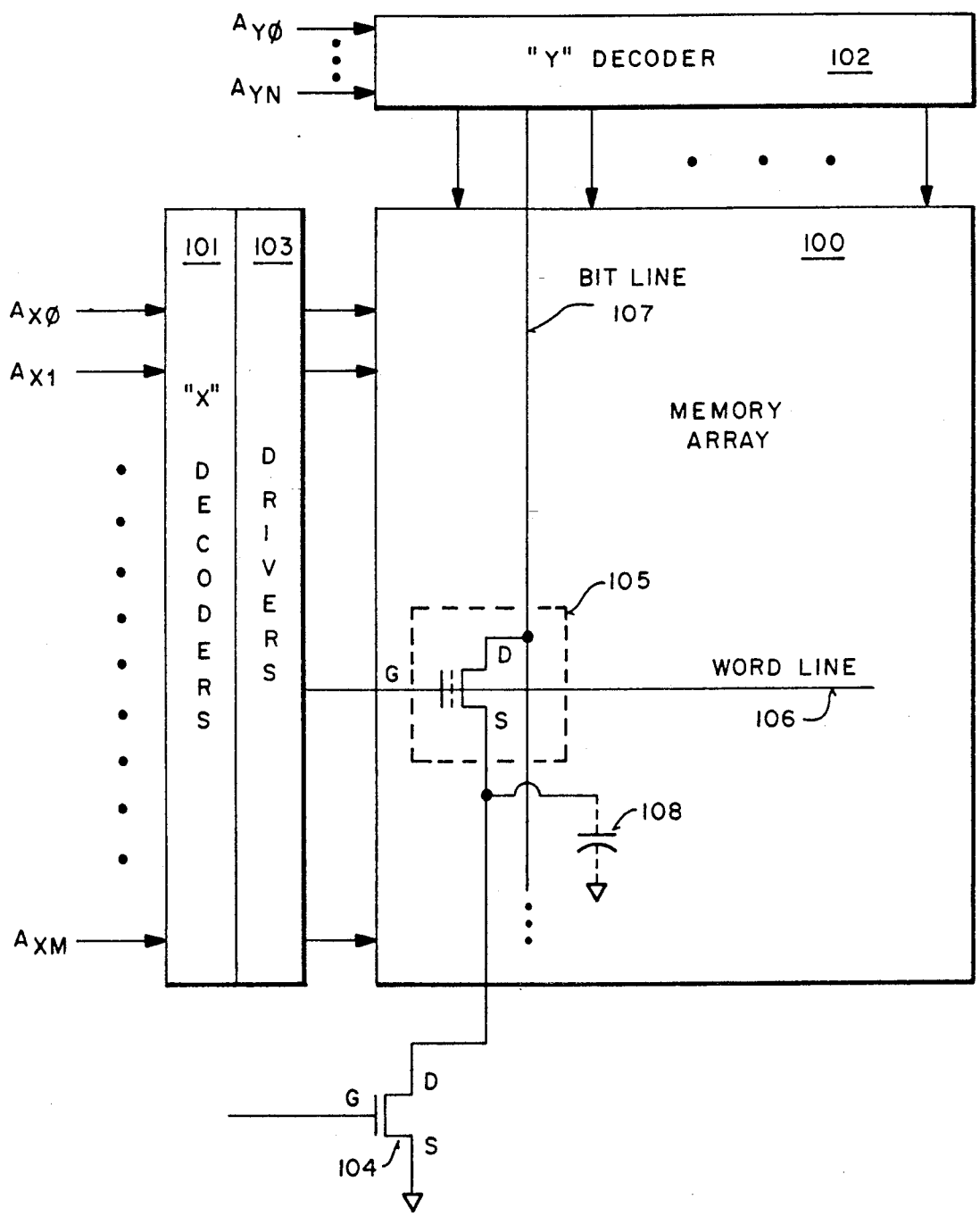
FIG_1

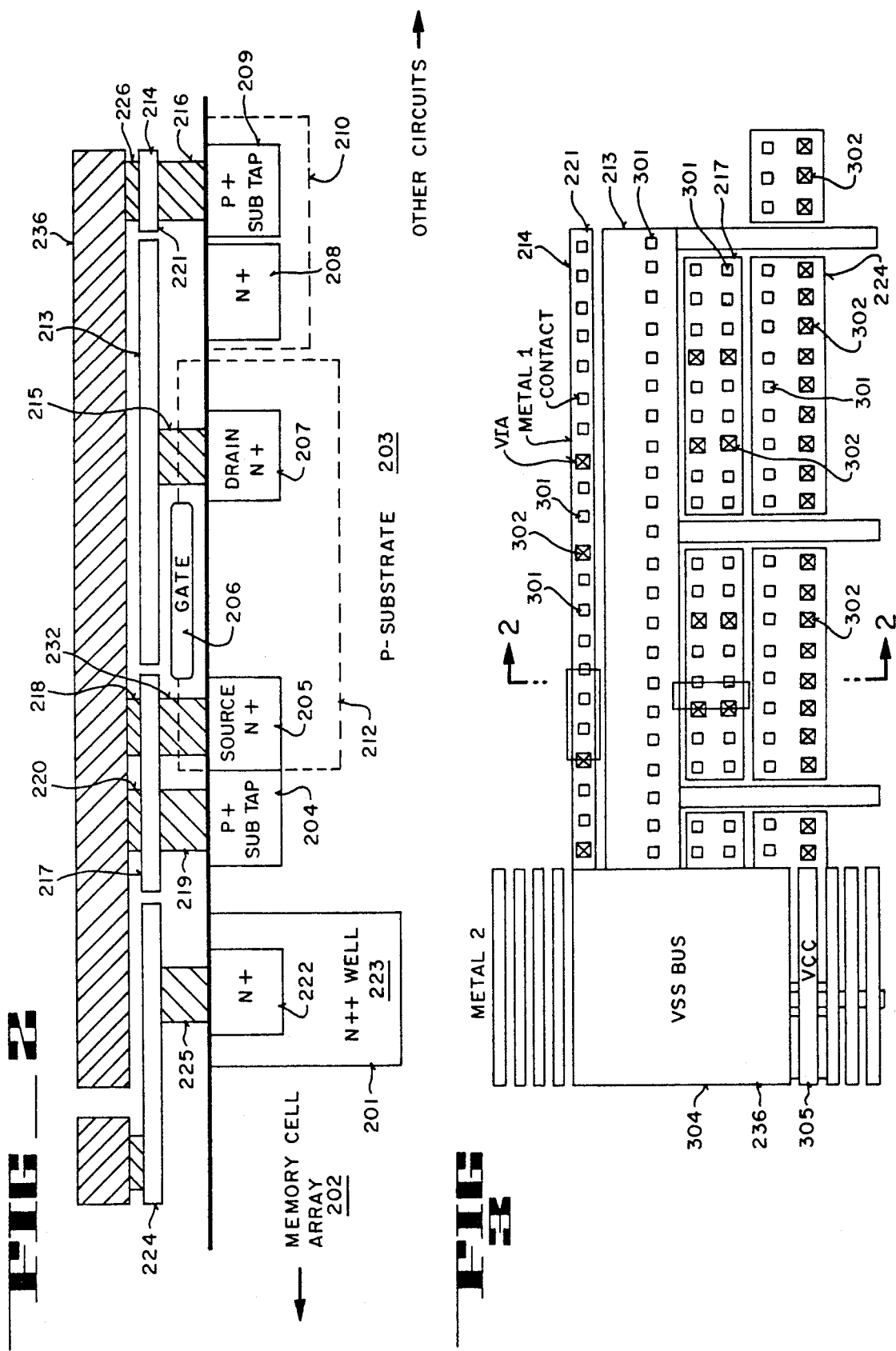

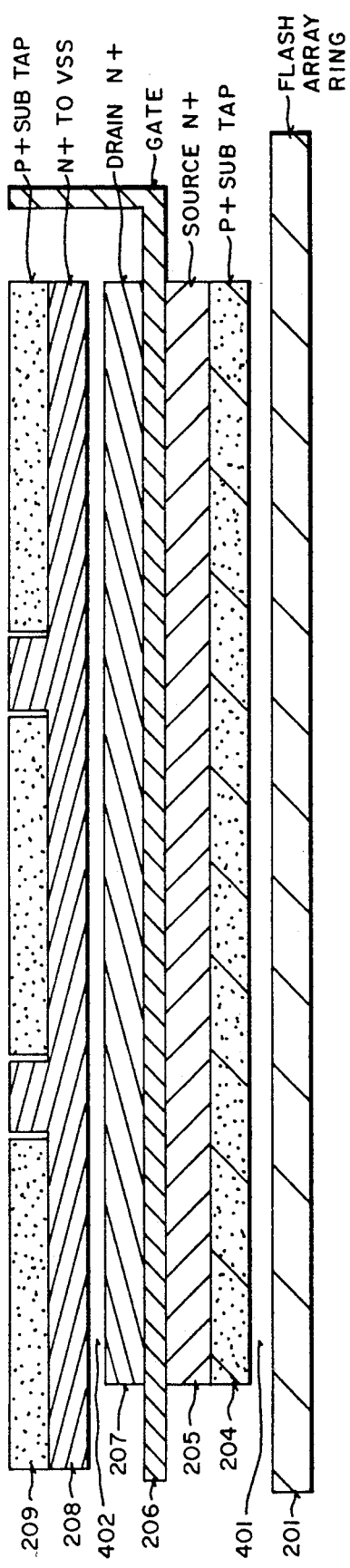
FIG_4
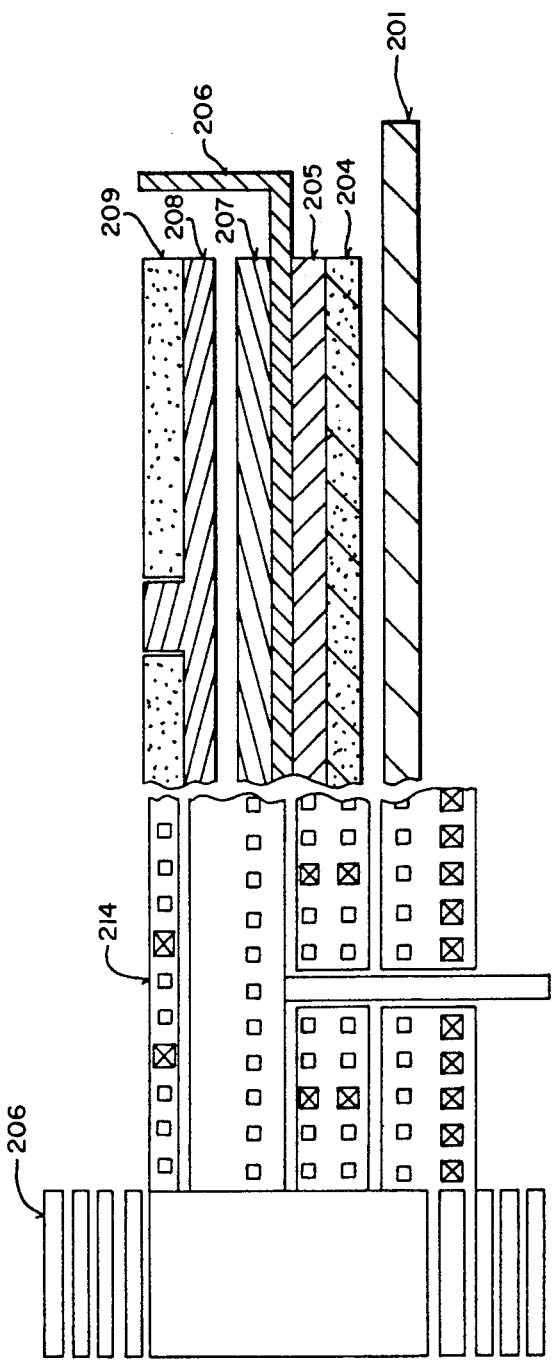
FIG_5

PROTECTED ERASE VOLTAGE DISCHARGE TRANSISTOR IN A NONVOLATILE SEMICONDUCTOR MEMORY

FIELD OF THE INVENTION

The present invention pertains to the field of nonvolatile semiconductor memories. More particularly, the present invention relates to a semiconductor layout arrangement having a relatively fast and low resistive path for discharging the erase voltage along with mechanisms for protecting periphery circuitry from stray current, all within a minimal amount of silicon area.

BACKGROUND OF THE INVENTION

Computer memories typically can be divided into two main categories: volatile and nonvolatile. Volatile memories retain their data only so long as power is applied. Nonvolatile memories retain their data after power is removed.

One type of prior nonvolatile semiconductor memory is the flash electrically erasable programmable read-only memory ("flash EEPROM"). A flash EEPROM is typically comprised of banks of memory cells. The memory cells can be programmed by a user to store data in the form of digital bits (i.e., 0s and 1s), wherein an individual memory cell stores one bit of data.

Once programmed, the flash EEPROM retains its data until erased. After erasure, the flash EEPROM can be reprogrammed with new data. The same flash EEPROM is typically capable of being cycled (i.e., erased and reprogrammed) thousands of times.

A memory cell is typically erased by applying 12 volts to the source of the transistor comprising the memory cell while simultaneously grounding its floating gate. Upon completion of the erasure operation, an erase verication operation is performed to verify that all memory cells have been properly erased. During the erase verification procedure, the source needs to be grounded. A separate switching transistor is often used to effectively ground the source for performing an erase verification.

Serious complications can arise, however, because of the parasitic capacitance typically inherent in a memory cell. One problem is that when a cell is being erased, the parasitic capacitance is charged with 12 volts. Later, when the source is grounded, the 12 volts stored in the parasitic capacitance is discharged through the switching transistor. Given a large number of memory cells that need to be verified, the cumulative effect of each of the parasitic capacitances typically results in a relatively large amount of current (i.e., a current spike) being discharged through the switching transistor. Putting this amount of current through the switching transistor can cause it to break down and "snap back." The snap back condition typically dumps a large charge into the transistor's substrate, which can cause peripheral circuits to latch-up.

Another concern is that the metal line grounding the source of the switching transistor typically has parasitic resistance. Because the metal line is required to sink a large amount of current, the parasitic resistance typically tends to pull the source node high. As described above, the source node should be set at zero volts for erase verification.

Yet another disadvantage with typical prior art flash EEPROM layouts is that the drain of the switching transistor is placed nearest to the memory cell array. Typically, a flash array ring is interposed between the memory cell array and the switching transistor to isolate the memory cell array. Because the flash array ring is typically comprised of an N++ doped region and the switching transistor's drain is comprised of an N+ doped region, standard design rules specify that these two regions should be separated by a relatively large P doped area, such as the P-substrate. A large gap between these two regions contributes to increasing the overall die size of the flash EEPROM. A large die size is undesirable because fewer dies can be made from a given silicon wafer. This directly translates into higher production costs for manufacturing each flash EEPROM.

SUMMARY AND OBJECTS OF THE INVENTION

In view of the problems associated with discharging the erase voltage in flash EEPROM memories, one object of the present invention is to minimize the die size of a flash EEPROM.

Another object of the present invention is to provide an erase voltage discharge path capable of handling large amounts of current.

Another object of the present invention is to discharge erase voltage quickly.

Another object of the present invention is to provide a low resistive erase voltage discharge path.

Yet another object of the present invention is to provide protection of periphery circuitry from stray current injected into the substrate during an erase voltage discharge.

A semiconductor memory is described. The semiconductor memory includes a memory cell for storing a bit of information. A means is provided for erasing the bit of information stored by the memory cell. A transistor is coupled to the source of the memory cell for grounding the source to verify that the memory cell has been erased. A charge stored by parasitic capacitance associated with the memory cell is discharged through the transistor. The transistor includes a polysilicon gate, a drain diffusion region, and a source diffusion region. The polysilicon gate is coupled to a control means for switching the transistor on and off. The drain diffusion region is coupled to the source of the memory cell. The source diffusion region is coupled to ground. The source diffusion region resides closer to the memory cell than the drain diffusion region for minimizing a diffusion distance between the transistor and the memory cell.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the Figures of the accompanying drawings, in which like references indicate similar elements, and in which:

FIG. 1 is a block diagram illustrating a flash memory array, decoders, drivers, and an erase voltage discharge switch.

FIG. 2 is a cross-sectional view illustrating a semiconductor layout of one embodiment of the present invention.

FIG. 3 is a top view of a semiconductor layout of the present invention illustrating the thin film layers.

FIG. 4 is a top view illustrating the various diffusion layers associated with the erase voltage discharge transistor.

FIG. 6 is a layout illustrating a portion of the flash array, a flash array guard ring, an erase voltage discharge transistor, and substrate tops.

DETAILED DESCRIPTION

Figure 5:
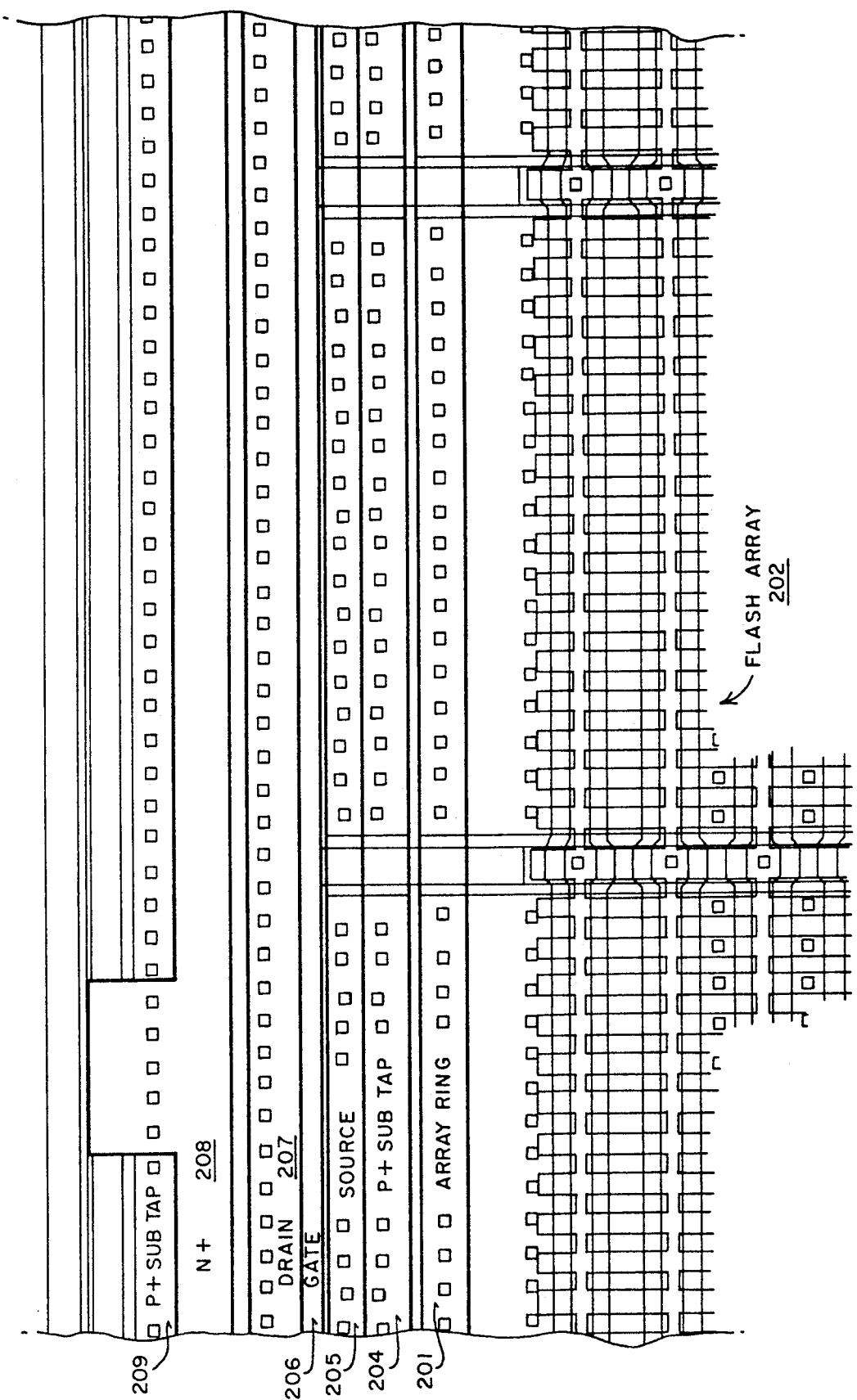
FIG. 5 is a top view illustrating the thin film metal layers and the diffusion layers of one embodiment.

FIG. 1 is a block diagram illustrating a flash memory array 100, X and Y decoders 101 and 102, drivers 103, and an erase voltage discharge switch 104. Memory array 100 is comprised of a plurality of memory cells, such as memory cell 105. A memory cell is a nonvolatile means for storing one bit of information.

A particular memory cell is accessed by word lines coupled to the floating gates of a particular row of memory cells and bit lines coupled to the drains of a particular column of memory cells. The intersection of a selected word line and bit line specifies a particular memory cell. For example, the selection of word line 106 and bit line 107 specifies memory cell 105. "X" decoder 101 decodes address signals $A_{X0}, A_{X1}, \ldots A_{XM}$ to determine the particular word line selected. Drivers 103 activate and drive the word line selected by the "X" decoder 101. "Y" decoder 102 selects a bit line to be activated by decoding address signals $A_{Y0}, A_{Y1}, \ldots A_{YN}$.

The data stored by a memory cell can be erased by grounding the cell's floating gate while supplying 12 volts to its source. After a cell has been erased, the erasure is verified. For erase verification, the source of the memory cell is placed at zero volts. An erase voltage discharge switch 104 comprising an n-channel transistor is switched ON/OFF to place the cell's source at either 12 volts during an erase sequence or 0 volts for a subsequent erase verification. Hence, the erase voltage discharge switch 104 is switched off by putting a low signal on its gate during an erase sequence. After an erase sequence, the source of the memory cell is set at 0 volts in order to verify that all cells have been properly erased. This is accomplished by putting a high signal onto the base of the erase voltage discharge transistor 104. In other words, the erase voltage discharge switch 104 is used to effectively ground the source of the memory cells.

To specify a particular memory cell for erasure, the word line and bit line corresponding to that memory cell are both pulled high. A single memory cell conducts from 5 to 10 nanoamperes ("nA") of current during an erase sequence. More than 4,000 memory cells can be erased simultaneously. Hence, the erase voltage discharge transistor 104 must be capable of sinking more than 20 milliamperes ("mA") while still pulling the sources of the memory cells to ground fast enough in order to have the voltage primarily across the memory cell during an erase verification sequence. Thus, the erase voltage discharge transistor 104 is made physically large in order to quickly discharge the voltage stored in the inherent n-well capacitances of the memory cells of more than 1,500 picofarads ("pf"), as represented by capacitor 108.

FIG. 2 is a cross-section of a semiconductor layout of one embodiment of the present invention. The erase voltage discharge transistor 212 is comprised of a source 205, a gate 206, and a drain 207. Source 205 is coupled to portion 217 of the metal 1 layer 214 by contact 232. It is also coupled to a metal 2 layer 236 by via 218. Metal 2 layer 236 is coupled to a grounded bond pad. Gate 206 is made up of a polysilicon layer and is coupled to a circuit that provides a signal to switch the erase voltage discharge transistor 212 "ON" and "OFF." In this manner, the source of a memory cell is either effectively grounded or at approximately 12 volts. Drain 207 is coupled to portion 213 of metal 1 layer 214 by contact 215.

Note that the source 205, rather than the drain 207, is placed closest to the memory cell array portion 202. This allows the erase voltage discharge transistor 212 to be placed relatively close to the memory cell array portion 201, thereby minimizing the area of silicon utilized. This distance is minimized because the P+ substrate tap can be located between them and can touch the source. In other words, the N+ (or N++) to P+ spacing is much smaller than an N+ (or N++) to N+ spacing.

In addition, a P+ substrate tap 204 can be placed next to source 205. The P+ substrate tap 204 is used to absorb stray electrons in the substrate (i.e., thus protecting nearby circuitry). It also provides an ohmic contact from source 205 to substrate 203 to mitigate metal parasitic resistance. It is coupled to portion 217 of the metal 1 layer 214 by contact 219. It is also coupled to the metal 2 layer 236 by via 220.

Ground (i.e., $V_{SS}$) can be accessed in the form of metal lines running to a grounded bond pad. For one embodiment, the metal line to ground is in the form of the metal 2 layer 236. These metal lines have parasitic resistance, which is undesirable. Hence, a P+ substrate tap 204 is used to mitigate the effect of the parasitic resistance. It acts as an ohmic connection between the source 205 and the p-substrate 203. Even though the P-substrate is grounded from the bottom, P+ substrate tap 204 provides a lower resistive ground connection for the P-substrate 203.

Furthermore, the parasitic resistance associated with the metal 2 layer 236 is put in parallel with the inherent resistance of the P-substrate, thereby reducing the overall resistance from the source of the erase voltage discharge transistor to ground. As current flowing through the metal 2 layer 236 to ground starts to pull the source node high (e.g., 0.1 to 0.2 volts) because of the parasitic resistance in the metal layer, P+ substrate tap 204 draws some of the current and sinks it to ground through p-substrate 203. In summary, P+ substrate tap 204 helps to locally ground the P-substrate 203 and better ground the source node by reducing the overall resistance from that node to ground.

To minimize the chances for undesirable break-down and latch-up conditions when discharging the erase voltage, several precautions are implemented in the semiconductor layout. A flash array ring 201 comprised of an N+ doped region 222 implemented within an N++ well 223 surrounds the memory cell array portion 202. The N+ 222 region is coupled to portion 224 of the metal 1 layer 214 by contact 225. Flash array ring 201 prevents electrons injected into the memory cell array portion 202 from straying out of the array 202 and randomly affecting other circuits. Flash array ring 201 isolates the memory cell array portion 202 from other circuits. Furthermore, it attracts certain impurities, thereby helping to keep those impurities away from the memory cell array portion 202.

In addition, a guard ring 210, comprised of an N+ 208 and a P+ 209 substrate tap, is interposed between the memory cell array portion 202, erase voltage discharge transistor 212, and other circuits 211. In other words, guard bar 210 surrounds the memory cell array portion 201 and the erase voltage discharge transistor 212. The P+ substrate tap 209 is coupled to portion 221 of metal layer 214 by contact 216. It is also coupled to the metal 2 layer 236 by via 226.

Because the flash array 202 and discharge transistor 212 generate many carriers, the P+ substrate tap 209 provides an ohmic contact to ground and also helps absorb electrons (i.e., similar to the P+ substrate tap 204). The P-N junction formed by the N+ substrate tap 208 creates a barrier to prevent electrons from passing by. There is a voltage associated with the P-N junction (i.e., P-substrate 203 and N region 208) of guard bar 210. When an electron drifts by, it is swept into this depletion region.

FIG. 3 is a top view of the semiconductor layout showing the thin film layers, namely metal 1 layer 214 and metal 2 layer 236. The metal 1 layer consists of a number of different portions 221, 213, 217, and 224, which overlay the semiconducting diffusion layers. The metal 2 layer 236 consists of a section 304 that is a $V_{SS}$ (i.e., ground) bus, a section 305 that is a $V_{CC}$ (i.e., power), and other buses. The $V_{SS}$ bus 304 is made wide to enhance its current carrying capacity. The metal 2 layer 236 overlays the metal 1 layer 214. Also shown are a plurality of contacts 301 for coupling various portions of the underlying diffusion layers to the metal 1 layer 214. Furthermore, a plurality of vias 302 for coupling various parts of the metal 1 layer 214 to the metal 2 layer 236 are shown. Reference marker 2—2 denotes the plane where the flash EEPROM was cut away to show the cross-section view of FIG. 2.

FIG. 4 is a top view showing the various diffusion layers associated with the erase voltage discharge transistor. The diffusion layer closest to the memory cell array is that of the flash array ring 201. A narrow strip 401 consisting of the P-substrate separates the flash array ring 201 from the P+ substrate tap 204. The P+ substrate tap 204 is placed adjacent to the N+ source 205 of the erase voltage discharge transistor. The N+ source 205 is placed next to the polysilicon gate 206. Next to gate 206 is the N+ drain 207. There is a small strip 402 of P-substrate separating the N+ drain 207 and the N+ substrate tap 208. The P+ substrate tap 209 is placed adjacent to and interleaving with the N+ substrate tap 208 so that they share a row of vias and contacts.

FIG. 5 is a top view showing all the layers, including the thin film layers of metal 1 layer 214 and metal 2 layer 206, along with the various diffusion layers 201 and 204–209.

FIG. 6 is a layout showing a portion of the flash array 202, flash array ring 201, P+ substrate tap 204, source 205, gate 206, drain 207, N+ substrate tap 208, and P+ substrate tap 209. In one embodiment, the erase voltage discharge transistor made up of source 205, gate 206, and drain 207 is a rather long device, running approximately the length of the flash array 202.

A nonvolatile flash EEPROM having a pull-down transistor for coupling the source of a memory cell to ground has been described. The source is pulled down to ground after the memory cell has been erased in order to verify the erasure. The source is pulled low quickly to minimize the time required to perform the verification. The voltage stored in the parasitic capacitance associated with the memory cell during the erase procedure is discharged through the pull-down transistor when erase verify procedure is initiated.

The pull-down transistor is comprised of a polysilicon gate coupled to a control means which switches the transistor ON/OFF; an N+ drain diffusion region coupled to the source of the memory cell; and an N+ source diffusion region coupled to ground. The source diffusion region is implemented to physically reside closer to the memory cell than the drain diffusion region. This layout arrangement minimizes the diffusion to diffusion distance between the pull-down transistor and the memory cell. This distance is minimized because a P+ substrate tap can be located between them and can touch the source. In other words, the N+ (or N++) to P+ spacing is much smaller than an N+ (or N++) to N+ spacing. As a result, the required amount of silicon area is minimized.

Two P+ substrate taps straddling the pull-down transistor are implemented to minimize substrate tap resistance and decrease localized current crowding in the substrate. An N+ diffusion region coupled to ground is implemented between the pull-down transistor and periphery circuitry. In addition, an N+ array ring surrounds the memory cell array. These two mechanisms are implemented to protect periphery circuitry from stray current injected into the substrate during the erase voltage discharge.

Because both the P+ and N+ diffusions are coupled to ground, they can be interleaved so that a single row of vias and contacts can be implemented to couple the two diffusions to ground. This further reduces the layout size since a single metal ground trace is used to connect to both P+ and N+ diffusions.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings, are, accordingly, to be regarded in an illustrative rather than a restrictive sense.

What is claimed is:

1. A semiconductor memory comprising:
   (A) a memory cell for storing a bit of information;
   (B) a means for erasing the bit of information stored by the memory cell;
   (C) a transistor coupled to the source of the memory cell for grounding the source to verify that the memory cell has been erased, wherein a charge stored by parasitic capacitance associated with the memory cell is discharged through the transistor, and wherein the transistor comprises:
      (1) a polysilicon gate coupled to a control means for switching the transistor on and off;
      (2) a drain diffusion region coupled to the source of the memory cell;
      (3) a source diffusion region coupled to ground, wherein the source diffusion region resides closer to the memory cell than the drain diffusion region;
   (D) a first substrate tap placed between the memory cell and the source diffusion region of the transistor for coupling the source of the memory cell to ground, wherein a diffusion distance between the transistor and the memory cell is minimized.

2. The semiconductor memory of claim 1 further comprising a second substrate tap placed adjacent to the drain diffusion region for absorbing stray electrons.

3. The semiconductor memory of claim 2 further comprising an N+ diffusion bar coupled to ground.

4. The semiconductor memory of claim 3, wherein the diffusion bar and the second substrate tap share a row of vias and contacts.

5. The semiconductor memory of claim 4 further comprising at least two thin film metal layers allowing placement of the source close to the memory cell.

6. The semiconductor memory of claim 5 further comprising a flash array ring surrounding at least one memory cell.

7. A nonvolatile flash electrically erasable programmable read only memory for storing digital data comprising:
- (A) a memory cell that can be programmed to store a bit of data;
- (B) a means for erasing the bit of data stored by the memory cell;
- (C) a transistor for reading the memory cell, wherein the transistor comprises:
  - (1) a drain diffusion region coupled to a source diffusion region of the memory cell;
  - (2) a source diffusion region of the transistor coupled to ground, wherein the source diffusion region of the transistor is implemented closer to the memory cell than the drain diffusion region;
  - (3) a polysilicon gate coupled to a means for controlling whether the transistor is conducting wherein when the transistor is conducting, the source diffusion region of the memory cell is coupled to ground and a potential stored by parasitic capacitance associated with the memory cell is discharged through the transistor;
- (D) a first substrate tap, coupled to ground, located adjacent to the source of the transistor, to provide a discharge means for discharging the potential stored by the parasitic capacitance associated with the memory cell, wherein a diffusion distance between the transistor and the memory cell is minimized.

8. The memory of claim 7 further comprising a second substrate tap located adjacent to the drain for minimizing localized current crowding in a substrate of the transistor.

9. The memory of claim 8 further comprising an N-doped diffusion bar coupled to a means for supplying power, the diffusion bar located in between the memory cell and the source of the transistor for minimizing stray current.

* * * * *